United States Patent [19]

Fabian

[11] Patent Number: 5,189,307
[45] Date of Patent: Feb. 23, 1993

[54] ISOLATED CURRENT MIRROR WITH OPTICAL INSULATOR GENERATING FEEDBACK SIGNAL

[75] Inventor: Liboslav Fabian, New Brighton, Minn.

[73] Assignee: Empi, Inc., St. Paul, Minn.

[21] Appl. No.: 851,052

[22] Filed: Mar. 13, 1992

[51] Int. Cl.$^5$ .................... G02B 27/00; H03K 3/42
[52] U.S. Cl. .................................. 250/551; 307/311
[58] Field of Search ........... 250/551, 214 A, 214 C, 250/214 SW; 307/311

[56] References Cited

U.S. PATENT DOCUMENTS

| 4,417,099 | 11/1983 | Pierce | 307/311 |
|---|---|---|---|
| 4,539,480 | 9/1985 | Artinano et al. | 250/551 |
| 4,596,048 | 6/1986 | Dunki et al. | 250/551 |
| 4,652,764 | 3/1987 | Nagano | 250/551 |
| 4,739,174 | 4/1988 | Nagano | 250/551 |
| 4,825,351 | 4/1989 | Uesugi | 307/311 |
| 4,902,901 | 2/1990 | Pernyeszi | 250/551 |
| 5,089,948 | 2/1992 | Brown et al. | 307/311 |

FOREIGN PATENT DOCUMENTS

| 3513883 | 10/1986 | Fed. Rep. of Germany | 307/311 |
|---|---|---|---|
| 0119334 | 5/1988 | Japan | 250/551 |
| 1524170 | 11/1989 | U.S.S.R. | 307/311 |
| 2002612 | 2/1979 | United Kingdom | 307/311 |

OTHER PUBLICATIONS

Dionics, Inc. Data Book, ISO-Gate Device Applications (Mar. 1989) (Isolation Amplifier shown in lower right hand corner of page).

Primary Examiner—David C. Nelms
Assistant Examiner—Michael Messinger
Attorney, Agent, or Firm—Kinney & Lange

[57] ABSTRACT

An optically isolated current mirror provides an isolated output signal as a function of an input signal. A first optical isolator generates an isolated control signal as a function of the input signal. An amplifier is connected in a voltage follower configuration which supplies the output signal as a function of the control signal and a feedback signal. A second optical isolator generates the feedback signal as a function of the output signal.

22 Claims, 2 Drawing Sheets

ISOLATED CURRENT MIRROR WITH OPTICAL INSULATOR GENERATING FEEDBACK SIGNAL

BACKGROUND OF THE INVENTION

The present invention relates to an isolated signal source. In particular, the present invention relates to an optically isolated current mirror.

There is a need for analog signal isolation in a wide variety of electronic applications. Historically, transformers have been used to isolate alternating current (AC) signals. For direct current (DC) applications, direct current signals have been isolated by first modulating the DC signal with an AC signal, then isolating the AC signal with a transformer and finally demodulating the DC signal from the AC signal.

The use of a transformer to perform the isolation has several disadvantages for DC applications. First, isolation transformers are relatively large and expensive. Second, modulating and then demodulating the DC signal requires complex circuitry which adds the the size and expense of the isolation circuit. Finally, isolation transformers require a separate power supply for each side of the isolation barrier. This increases the power consumption of the isolation circuit.

Recently, circuit designers have started using optical devices for isolation. These designs, however, have been complex and have required a power supply on each side of the isolation barrier. Further, optical isolators have transfer ratios with relatively high temperature coefficients. This reduces the accuracy of the isolated signal and the effectiveness of the overall isolation circuit.

SUMMARY OF THE INVENTION

The present invention provides an isolated signal source for generating an isolated output signal as a function of an input signal. The isolated signal in the transfer ratios of the first and second optical isolators.

Preferably, the first and second optical isolators have substantially the same temperature coefficients. This can be achieved by selecting optical isolators from the same fabrication substrate or lot. By placing the second optical isolator in the feedback loop of the amplifier, the relatively high temperature coefficients of the optical isolators cancel one another such that the overall temperature coefficient of the circuit is negligible.

In one embodiment, the first and second optocouplers each include an input light-emitting diode and an output phototransistor. The input diode of the first optical isolator receives the input current and transmits an infrared signal which energizes the phototransistor. The phototransistor conducts current as a function of the input current within its operating limits. The current flowing through the phototransistor is passed through the first resistor to provide a control voltage at the first amplifier control terminal.

The input diode of the second optical isolator is connected to the amplifier output terminal for receiving the output current. The input diode transmits an infrared signal to phototransistor. The phototransistor of the second optical isolator conducts current as a function of the output current within its operating limits. The current flowing through the phototransistor is passed through the second resistor to provide a feedback voltage at the second amplifier control terminal.

In an alternative embodiment, the first and second optical isolators include output phototransistors source includes a source of the input signal, an amplifier and first and second optical isolators. The amplifier has first and second control terminals and an output terminal. The amplifier generates the output signal on the output terminal as a function of a control signal and a feedback signal. The first optical isolator is connected between the input signal source and the first amplifier control terminal for generating the control signal as a function of the input signal. The second optical isolator is connected between the amplifier output terminal and the second amplifier control terminal for generating the feedback signal as a function of the output signal.

First and second supply terminals are connected across the amplifier. A first bias resistor is connected between the first amplifier control terminal and the second supply terminal. A second bias resistor is connected between the second amplifier control terminal and the second supply terminal.

In one embodiment, the amplifier, the first and second resistors and the first and second optical isolators are connected together in a voltage follower configuration such that the output signal follows the input signal. The amplifier controls the current through its output terminal to maintain equal voltages at its control terminals.

If the transfer ratios of the first and second optical isolators are equal and the resistance values of the first and second bias resistors are equal, then the output signal will be substantially equal to the input signal. A trimmer resistor can be connected in series with the second resistor to compensate for any variation connected in a Darlington configuration. In another alternative embodiment, the first and second optical isolators include an photovoltaic output formed by a plurality of series-connected silicon pn junctions. In this embodiment, the outputs of the first and second isolators are connected in parallel across the first and second resistors, respectively.

The isolated signal source of the present invention has a relatively simplistic circuit design which employs commonly available, inexpensive parts. A significant advantage of the isolation scheme of the present invention is that there is no need for a separate power supply on the input side of the circuit to sense the input current. The light-emitting diode transfers energy directly from the input current to the output side of the circuit. Only a single power supply is required to drive the amplifier and transistors in the output side of the circuit. As a result, the power consumption of the isolation circuit is lower than isolation circuits of the prior art. Further, the isolation circuit is relatively insensitive to variations in temperature. High temperature coefficients have traditionally reduced the effectiveness of using optical isolators in circuits of the prior art.

DETAILED DESCRIPTION OF THE PREFERRED EMBODIMENTS

The isolated current mirror of the present invention provides an isolated output current which is a function of an input current. A first optical isolator generates an isolated control signal which is a function of the input current. A second optical isolator is connected in a feedback loop of an amplifier. The amplifier generates the output current as a function of the control signal, generated by the first isolator, and a feedback signal, generated by the second isolator.

Figure 1:
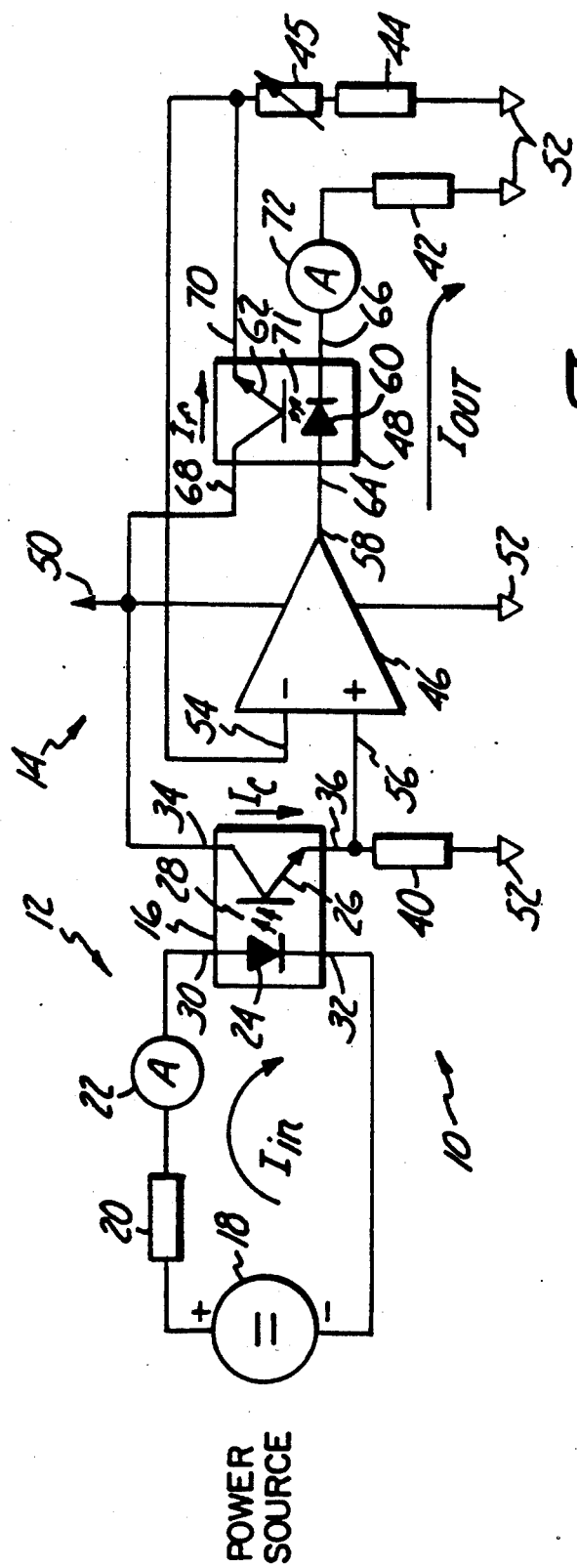
FIG. 1 is a schematic diagram of an isolated signal source with a pair of phototransistor optocouplers, in accordance with the present invention.

FIG. 1 is a schematic diagram of an optically isolated current mirror 10, in accordance with the present invention. Current mirror 10 generates an isolated output current $I_{out}$ which is equal to an input current $I_{in}$. Current mirror 10 includes an input circuit 12 and an output circuit 14. Input circuit 12 and output circuit 14 are electrically isolated from one another by an optical isolator 16.

Input circuit 12 includes an input circuit power source 18 and a circuit resistance 20. Circuit resistance 20 is connected in series with power source 18. Power source 18 generates input current $I_{in}$ through circuit resistance 20. An ampere meter 22 may be connected in series with input circuit 12 to measure input current $I_{in}$.

In the embodiment shown in FIG. 1, optical isolator 16 includes a light-emitting diode (LED) 24 and a phototransistor 26. LED 24 is connected in series with input circuit 12 to receive input current $I_{in}$. LED 24 is optically coupled too, but electrically isolated from, phototransistor 26. LED 24 emits an infrared signal 28 which energizes phototransistor 26.

Optical isolator 16 includes input terminals 30 and 32 and output terminals 34 and 36. The anode of LED 24 is connected to input terminal 30. The cathode of LED 24 is connected to input terminal 32. The collector of phototransistor 26 is electrically connected to output terminal 34. The emitter of phototransistor 26 is electrically connected to output terminal 36. The collector and emitter of phototransistor 26 define a control current path $I_c$ which is a function of input current $I_{in}$. The magnitude of control current $I_c$ depends upon the transfer ratio and temperature coefficient of optical isolator 16.

Output circuit 14 includes bias resistors 40, 42, 44 and 45, an amplifier 46, an optical isolator 48 and power supply terminals 50 and 52. In the embodiment shown in FIG. 1, amplifier 46 is an operation amplifier. Amplifier 46 is connected between supply terminals 50 and 52. Amplifier 46 includes a inverting input terminal 54, a noninverting input terminal 56 and a output terminal 58. Noninverting input terminal 56 is connected to optical isolator output terminal 36 and to resistor 40. Resistor 40 is connected between noninverting input terminal 56 and supply terminal 52. Optical isolator output terminal 34 is connected to supply terminal 50.

Optical isolator 48 is connected in a feedback loop of amplifier 46 between amplifier output terminal 58 and inverting amplifier input terminal 54. Optical isolator 48 includes a light-emitting diode (LED) 60, a phototransistor 62, input terminals 64 and 66 and output terminals 68 and 70. Optical isolator input terminal 64 is connected to amplifier output terminal 58 to receive an output current $I_{out}$ from amplifier 46. LED 60 emits an infrared signal 71 which energizes phototransistor 62 to generate a feedback current $I_f$ which is a function of output $I_{out}$.

The anode of LED 60 is connected to input terminal 64. The cathode of LED 60 is connected to input terminal 66. The collector of phototransistor 62 is connected to output terminal 68. The emitter of phototransistor 62 is connected to output terminal 70. The collector and emitter of phototransistor 62 define a current path for feedback current $I_f$. The magnitude of feedback current $I_f$ depends upon the magnitude of output current $I_{out}$ and the transfer ratio and temperature coefficient of optical isolator 48.

An ampere meter 72 can be connected in series with optical isolator output terminal 66 to monitor output current $I_{out}$. Resistor 42 is connected between ampere meter 72 and supply terminal 52. Resistor 42 represents a circuit load on output current $I_{out}$.

Optical isolator output terminal 68 is connected to supply terminal 50. Output terminal 70 is connected to inverting amplifier input terminal 54. Resistor 44 is connected between inverting amplifier input terminal 54 and supply terminal 52. Variable trimmer resistor 45 can be connected in series with resistor 44 to compensate for any differences in the transfer ratios of optical isolators 16 and 48.

Resistor 44 converts feedback current $I_f$ into a feedback voltage on inverting input terminal 54. Similarly, resistor 40 converts control current $I_c$ into a control voltage on noninverting input terminal 56. Amplifier 46 is connected in a voltage follower configuration which generates the output current $I_{out}$ as a function of the control voltage on noninverting input terminal 56 and the feedback voltage on inverting input terminal 54.

In operation, output current $I_{out}$ follows input current $I_{in}$. Amplifier 46 controls output current $I_{out}$ to maintain the control voltage and the feedback voltage on its inverting and noninverting input terminals 54 and 56 substantially the same. If the control voltage and the feedback voltage are the same and resistors 40 and 44 (and 45) are the same, then the control current $I_c$ and the feedback current $I_f$ are the same. If the transfer ratios of optical isolators 16 and 48 are the same, then the output current $I_{out}$ and the input current $I_{in}$ will be the same. Therefore, isolated signal source 10 mirrors input current $I_{in}$ in the isolated output current $I_{out}$.

A common disadvantage of using optical devices for isolation is that the optical devices have a relatively high temperature coefficient which causes the transfer ratio to vary with temperature. However, the optically isolated signal source shown in FIG. 1 is relatively insensitive to temperature. In a preferred embodiment, optical isolators 16 and 48 are fabricated on the same substrate or the same lot so they have substantially the same temperature coefficients and transfer ratios. Similarly, resistors 40 and 44 preferably have the same resistances and temperature coefficients. The temperature coefficient of the overall circuit is negligible because the transfer ratios cancel one another with the feedback configuration of the present invention. Therefore, output current $I_{out}$ is substantially equal to input current $I_{in}$, regardless of temperature.

Isolated signal source 10 has a relatively simplistic circuit design and contains relatively inexpensive parts which are commercially available. A major advantage of the isolated signal source of the present invention is that an additional power supply is not required in the input circuit to sense the input current $I_{in}$. Only a single power supply is required in the circuit to drive phototransistors 26 and 62 and operational amplifier 46.

Figure 2:
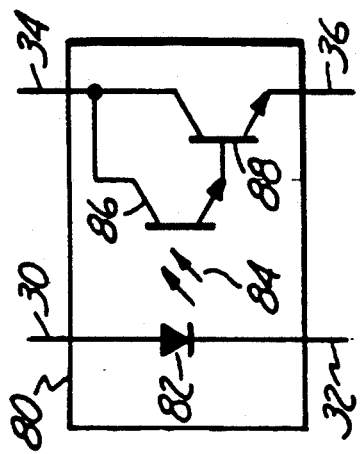
FIG. 2 is a schematic diagram of an alternative optocoupler which can be used in the isolated signal source shown in FIG. 1.

Other types of optical isolators can also be used with the present invention. For example, FIG. 2 illustrates a Darlington-connected optical isolator 80 which can be used in replace of optical isolators 16 and 48 shown in FIG. 1. Optical isolators such as those shown in FIGS. 1 and 2 are also referred to as "optoisolators", "optocouplers" and "photocouplers", for example.

Similar to isolators 16 and 48, optical isolator 80 includes input terminals 30 and 32 and output terminals 34 and 36. Optical isolator 80 further includes a light-emitting diode (LED) 82 having an anode which in connected to input terminal 30 and a cathode which is connected input terminal 32. A phototransistor 86 is connected in Darlington-configuration with a transistor 88. The collectors of transistors 86 and 88 are connected to output terminal 34. The emitter of transistor 86 is connected to the base of transistor 88. The emitter of transistor 88 is connected to output terminal 36. LED 82 emits an infrared signal 84 which energizes phototransistor 86.

Figure 3:
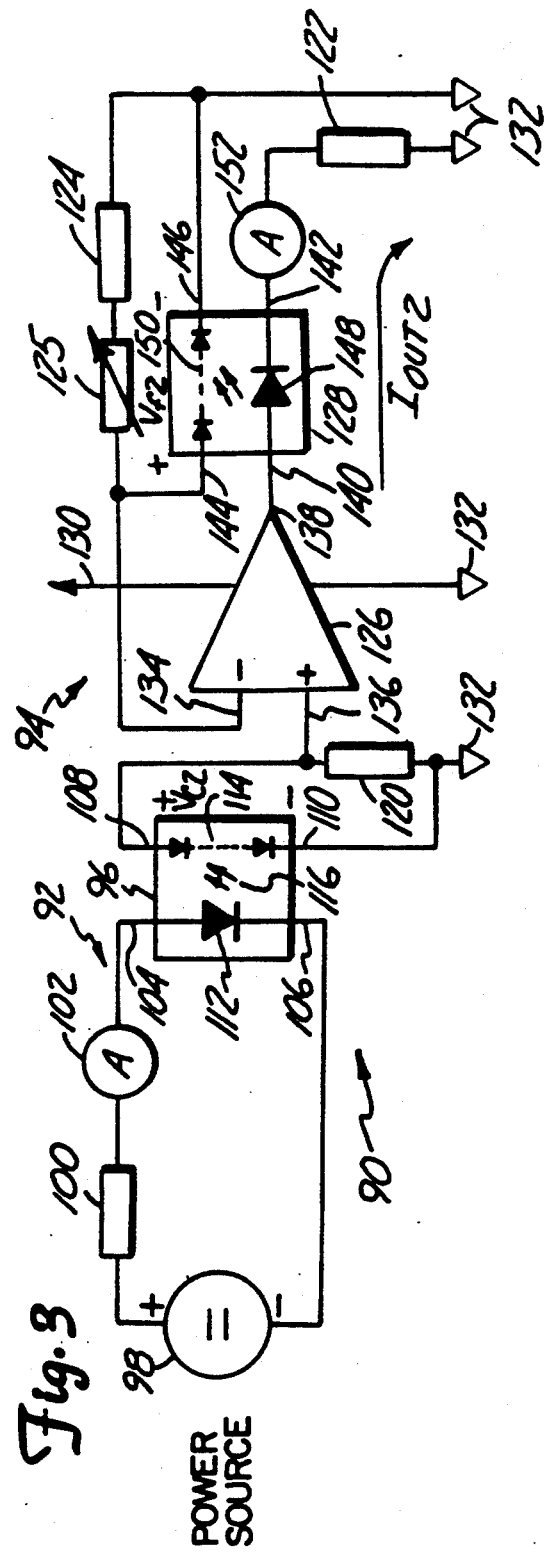
FIG. 3 is a schematic diagram of an isolated signal source having a pair of photovoltaic optical isolators, in accordance with the present invention.

FIG. 3 is schematic diagram of an isolated signal source having a pair of photovoltaic isolators, in accordance with the present invention. Isolated signal source 90 includes an input circuit 92 and an output circuit 94 which are separated by a photovoltaic isolator 96. Input circuit 92 includes a power source 98 and a circuit resistance 100. Power source 92 generates an input current $I_{in2}$ through circuit resistance 100. An ampere meter 102 can be connected in series with power source 98 and circuit resistance 100 to monitor input current $I_{in2}$.

Photovoltaic isolator 96 includes input terminals 104 and 106, output terminals 108 and 110, a light-emitting diode (LED) 112 and a plurality of silicon pn junctions 114. The anode of LED 112 is connected to input terminal 104. The cathode of LED 112 is connected to input terminal 106. The plurality of silicon pn junctions 114 are connected in series between output 108 and 110.

LED 112 is connected in series with input circuit 92 to receive input current $I_{in2}$. LED 112 is optically coupled to, but electrically from pn junctions 114. LED 112 transmits an infrared signal 116 which energizes, by photovoltaic action, the plurality of pn junctions 114. The energy transmitted by LED 112 directly generates an output control voltage $V_{c2}$ across isolator output terminals 108 and 110 which is a function of input current $I_{in2}$. A separate power supply is not required to generate output voltage $V_{c2}$.

The current flowing through the plurality of pn junctions 114 is substantially smaller than the current flowing through phototransistor 28, shown in FIG. 1. This translates into less power consumption in the photovoltaic version shown in FIG. 3 than in the phototransistor version shown in FIG. 1.

Output circuit 94 includes bias resistors 120, 122 124 and 125, amplifier 126, photovoltaic isolator 128 and supply terminals 130 and 132. Resistor 120 is connected in parallel across isolator output terminals 108 and 110. Amplifier 126 is connected between supply terminals 130 and 132. Amplifier 126 includes inverting input terminal 134, noninverting input terminal 136 and output terminal 138. Noninverting input terminal 136 is connected to isolator output terminal 108 for receiving the control voltage $V_{c2}$.

Photovoltaic isolator 128 is connected in a feedback loop of amplifier 126 between amplifier output terminal 138 and inverting amplifier input terminal 134. Photovoltaic isolator 128 includes input terminals 140 and 142, output terminals 144 and 146, a light-emitting diode (LED) 158 and a plurality of pn junctions 150. LED 148 has an anode which is connected to input terminal 140 and a cathode which is connected to input terminal 142. The plurality of pn junctions 150 are connected in series between output terminals 144 and 146.

Isolator input terminal 140 is connected to amplifier output terminal 138 to receive output current $I_{out2}$. Resistor 124 is connected in parallel across isolator output terminals 144 and 146. Variable trimmer resistor 125 can be connected in series with resistor 124 to compensate for any variation in the transfer ratios of isolators 96 and 128. Isolator output terminal 144 is connected to amplifier inverting input 134. Isolator output terminal 146 is connected to supply terminal 132.

Photovoltaic isolator 128 generates a feedback voltage $V_{f2}$ which is a function output current $I_{out2}$. Feedback voltage $V_{f2}$ is applied to inverting amplfier input terminal 134. Amplifier 126 generates output current $I_{out2}$ as a function of control voltage $V_{c2}$ and feedback voltage $V_{f2}$. An ampere meter 152 can be connected in series with isolator output 142 to monitor output current $I_{out2}$. Resistor 122 is connected in series between ampere meter 152 and supply terminal 132. Resistor 122 represents a circuit load on output current $I_{out2}$.

Output current $I_{out2}$ will be substantially equal to input current $I_{in2}$, provided photovoltaic isolators 96 and 128 have the same transfer ratios and temperature coefficients and resistors 120 and 124 (and 125) have the same resistance values. Amplifier 126 drives output current $I_{out2}$ to a level sufficient to maintain substantially the same voltages at its input terminals 134 and 136. If feedback voltage $V_{v2}$ is equal to control voltage $V_{c2}$ and the transfer ratios of photovoltaic isolators 96 and 128 are the same, then output current $I_{out2}$ will be the same as input current $I_{in2}$.

The optical current mirror of the present invention is simplistic, inexpensive and relatively insensitive to temperature. The circuit does not require a power supply on the input side of the isolation barrier to sense the input current. In the photovoltaic version shown in FIG. 3, the isolator directly transforms the input current into an isolated output voltage without requiring a separate power supply to generate the output voltage. The photovoltaic version consumes even less power than the phototransistor versions shown in FIGS. 1 and 2.

The optically isolated current mirror of the present invention uses electrical components which are commercially available. An example of a diodephototransistor optical isolator which can be used in the embodiment shown in FIG. 1 is a PC817 series photocoupler, manufactured by Sharp. An example of a photovoltaic isolator which can be used in the embodiment shown in FIG. 3 is a PV15100, manufactured by International Rectifier. Other optical isolators can also be used with the present invention.

The present invention can be used in a wide variety of applications which include, but are not limited to, multiple-site medical iontophoresis and transcutaneous electrical nerve stimulation. In medical iontophoresis, ionic drugs are transferred through a patient's skin by applying a DC current to a drug solution through pair of electrodes attached to the patient's skin. A multiple-site iontophoresis device delivers ionic drugs through a plurality of electrode pairs. Each pair is driven by a separate driver channel. Each driver channel is electrically isolated from the other driver channels. An example of a multiple-site iontophoresis device is disclosed in copending application Williams et al U.S. Ser. No. 07/649,495, filed Feb. 1, 1991 and assigned to Empi, Inc.

Although the present invention has been described with reference to preferred embodiments, workers skilled in the art will recognize that changes may be made in form and detail without departing from the spirit and scope of the invention. For example, a variety of optical isolators and amplifiers can be used with the present invention. Further, other biasing schemes can be used without departing from the scope of the invention. The present invention can be used in a wide variety of applications which include in addition to medical iontophoresis and transcutaneous electrical nerve stimulation.

What is claimed is:

1. An isolated signal source for providing an output signal as a function of an input signal, comprising:
   a source of the input signal;
   an amplifier having first and second control terminals and an output terminal, the amplifier providing the output signal on the output terminal as a function of a control signal and a feedback signal;
   a first optical isolator connected between the input signal source and the first amplifier control terminal for generating the control signal as a function of the input signal; and
   a second optical isolator connected between the amplifier output terminal and the second amplifier control terminal for generating the feedback signal as a function of the output signal.

2. The isolated signal source of claim 1 wherein the first and second optical isolators each include a light-emitting diode input and a phototransistor output.

3. The isolated signal source of claim 1 wherein the first and second optical isolators each include a light-emitting diode input and a Darlington-connected phototransistor output.

4. The isolated signal source of claim 1 wherein the first and second optical isolators each include a light-emitting diode input and a photovoltaic output.

5. The isolated signal source of claim 1 wherein the first and second optical isolators have substantially the same transfer ratios.

6. The isolated signal source of claim 1 wherein the first and second optical isolators have substantially the same temperature coefficients.

7. The isolated signal source of claim 1 and further comprising:
   first and second supply terminals connected across the amplifier;
   a first bias resistor connected between the first control terminal and the second supply terminal; and
   a second bias resistor connected between the second control terminal and the second supply terminal.

8. The isolated signal source of claim 7 wherein the first and second resistors have substantially the same resistance values.

9. The isolated signal source of claim 7 wherein the first and second resistors have substantially the same temperature coefficients.

10. The isolated signal source of claim 7 and further comprising a trimmer resistor connected in series with the second bias resistor.

11. The isolated signal source of claim 7 wherein:
   the first and second optical isolators each include a phototransistor connected between a pair of output terminals;
   the output terminals of the first optical isolator are connected in series between the first bias resistor and the first supply terminal; and
   the output terminals of the second optical isolator are connected in series between the second bias resistor and the first supply terminal.

12. The isolated signal source of claim 7 wherein:
   the first and second optical isolators each include a photovoltaic output connected between a pair of output terminals;
   the output terminals of the first optical isolator are connected in parallel across the first bias resistor with one output terminal connected to the first control terminal and the other output terminal connected to the second supply terminal; and
   the output terminals of the second optical isolator are connected in parallel across the second bias resistor with one output terminal connected to the second control terminal and the other output terminal connected to the second supply terminal.

13. The isolated signal source of claim 7 wherein the amplifier is connected to the first and second optical isolators and the first and second bias resistors in a voltage follower configuration having unity gain.

14. An isolated source for providing an output signal as a function of an input signal, the source comprising:
   a source of the input signal;
   a first optical isolator for converting the input signal to a control signal;
   an amplifier for supplying the output signal as a function of the control signal and a feedback signal; and
   a second optical isolator for deriving the feedback signal as a function of the output signal.

15. The isolated source of claim 14 wherein the amplifier is connected between the first and second optical isolators in a voltage follower configuration with unity gain such that the output signal is substantially equal to the input signal.

16. The isolated source of claim 15 wherein the first and second optical isolators have substantially the same transfer ratios and temperature coefficients.

17. The isolated source of claim 14 wherein the first and second optical isolators each include a light-emitting diode input and a phototransistor output.

18. The isolated source of claim 14 wherein the first and second optical isolators each include a light-emitting diode input and a Darlington-connected phototransistor output.

19. The isolated source of claim 14 wherein the first and second optical isolators each include a light-emitting diode input and a photovoltaic output.

20. An isolated current mirror for generating an output signal which is isolated from and substantially equal to an input signal, the mirror comprising:
   a source of the input signal;
   means for generating an optically isolated control signal as a function of the input signal;
   means for generating an optically isolated feedback signal as a function of the output signal; and
   means for generating the output signal as a function of the control signal and the feedback signal such that the output signal is substantially equal to the input signal.

21. An isolated current mirror comprising:
   first and second supply terminals;
   a source for supplying an input current;
   an amplifier connected between the first and second supply terminals and having first and second control terminals and an output terminal, wherein the amplifier supplies an output current on the output terminal as a function of a control signal and a feedback signal received on the first and second control terminals, respectively;

a first resistor connected between the first control terminal and the second supply terminal;

a second resistor connected between the second control terminal and the second supply terminal;

a first optocoupler having a light-emitting diode connected in series with the source for receiving the input current and having a phototransistor connected between the first supply terminal and the first amplifier control terminal for providing the control signal to the first amplifier control terminal for providing the control signal to the first amplifier control terminal as a function of the input current; and a second optocoupler having a light-emitting diode connected in series with the amplifier output terminal for receiving the output current and having a phototransistor connected between the first supply terminal and the second amplifier control terminal resistor for providing the feedback signal to the second amplifier control terminal as a function of the output current.

22. An isolated current mirror comprising:

a first and second supply terminals;

a source for supplying an input current;

an amplifier connected between the first and second supply terminals and having first and second control terminals and an output terminal, wherein the amplifier supplies an output current on the output terminal as a function of a control signal and a feedback signal received on the first and second control terminals respectively;

a first resistor connected between the first control terminal and the second supply terminal;

a second resistor connected between the second control terminal and the second supply terminal;

a first photovoltaic isolator having a light-emitting diode connected in series with the source for receiving the input current and having a photovoltaic output connected across the first resistor, between the first amplifier control terminal and the second supply terminal, for providing the control signal to the first amplifier control terminal; and a second photovoltaic isolator having a light-emitting diode connected in series with the amplifier output terminal for receiving the output current and having a photovoltaic output connected across the second resistor, between the second amplifier control terminal and the second supply terminal, for providing the feedback signal to the second amplifier control terminal.

* * * * *

UNITED STATES PATENT AND TRADEMARK OFFICE
CERTIFICATE OF CORRECTION

PATENT NO. : 5,189,307
DATED : February 23, 1993
INVENTOR(S) : LIBOSLAV FABIAN It is certified that error appears in the above-identified patent and that said Letters Patent is hereby corrected as shown below:

```
On the Title Page of the Patent, delete [54]
   ISOLATED CURRENT MIRROR WITH OPTICAL
   INSULATOR GENERATING FEEDBACK SIGNAL insert [54]  ISOLATED CURRENT MIRROR WITH OPTICAL ISOLATOR
             GENERATING FEEDBACK SIGNAL
```

Signed and Sealed this

Thirtieth Day of November, 1993

Attest:

BRUCE LEHMAN

*Attesting Officer*      *Commissioner of Patents and Trademarks*